(12) United States Patent  
Hayashi et al.

(10) Patent No.: US 7,883,830 B2
(45) Date of Patent: Feb. 8, 2011

(54) PHOTOSENSITIVE PLANOGRAPHIC PRINTING PLATE

(75) Inventors: Koji Hayashi, Tatebayashi (JP); Eiji Hayakawa, Utsunomiya (JP)

(73) Assignee: Kodak Japan Ltd. and NEC Engineering Ltd., Chiyoda-Ku, Tokyo (JP)

( * ) Notice: Subject to any disclaimer, the term of this patent is extended or adjusted under 35 U.S.C. 154(b) by 481 days.

(21) Appl. No.: 11/817,876

(22) PCT Filed: Mar. 15, 2006

(86) PCT No.: PCT/JP2006/305619

§ 371 (c)(1),
(2), (4) Date: Sep. 6, 2007

(87) PCT Pub. No.: WO2006/109454

PCT Pub. Date: Oct. 19, 2006

(65) Prior Publication Data

US 2008/0280228 A1    Nov. 13, 2008

(30) Foreign Application Priority Data

Mar. 30, 2005   (JP)   .............................. 2005-099741

(51) Int. Cl.
G03F 7/00 (2006.01)
G03F 7/26 (2006.01)

(52) U.S. Cl. ................. 430/281.1; 430/270.1; 430/302; 101/463.1; 101/453; 101/454

(58) Field of Classification Search .............. 430/270.1, 430/302, 278.1
See application file for complete search history.

(56) References Cited

U.S. PATENT DOCUMENTS

| 4,722,975 | A | 2/1988 | Itoh et al. | |
| 5,919,601 | A * | 7/1999 | Nguyen et al. | ............ 430/278.1 |
| 6,228,559 | B1 | 5/2001 | Oda | |
| 7,049,048 | B2 * | 5/2006 | Hunter et al. | ............ 430/278.1 |
| 7,314,699 | B2 * | 1/2008 | Gries | ...................... 430/270.1 |
| 7,524,613 | B2 * | 4/2009 | Baumann et al. | ......... 430/272.1 |
| 2003/0143407 | A1 | 7/2003 | Yamasaki et al. | |
| 2008/0160444 | A1 * | 7/2008 | Fiebag et al. | ............ 430/270.1 |

OTHER PUBLICATIONS

JP Abstract 60-084310.
JP Abstract 04-085541.
JP Abstract 10-161316.
JP Abstract 2003-057831.

* cited by examiner

*Primary Examiner*—Cynthia H Kelly
*Assistant Examiner*—Chanceity N Robinson
(74) *Attorney, Agent, or Firm*—J. Lanny Tucker

(57) ABSTRACT

A photosensitive planographic printing plate comprising a substrate and a photosensitive layer including a photopolymerizable compound, wherein the photosensitive layer and the substrate are provided between them with an undercoat layer including a (co)polymer having structural units having ethylenically unsaturated groups bonded with silicon atoms and phosphonic acid groups.

19 Claims, No Drawings

PHOTOSENSITIVE PLANOGRAPHIC PRINTING PLATE

TECHNICAL FIELD

The present invention relates to a photosensitive planographic printing plate, more particularly relates to a photosensitive planographic printing plate provided with an undercoat layer between the substrate and photosensitive layer.

BACKGROUND ART

In recent years, along with the advances in computer image treatment technology, a method has been developed for directly drawing an image on a photosensitive layer by emission of light corresponding to a digital signal. Attention is now focusing on computer-to-plate (CTP) systems utilizing that method for a planographic printing plate master and directly forming an image on a photosensitive planographic printing plate without output to a silver salt mask film.

As a negative type photosensitive planographic printing plate for a CTP system, for example, there is the so-called photopolymer type comprising a photosensitive layer made of mainly a photocuring resin formed on a substrate. In a photopolymer type photosensitive planographic printing plate, the photopolymerization initiator included in the photosensitive layer is activated at the time of exposure whereupon radicals are produced and, due to this, the photocuring resin is cross-linked and insolubilized and thereby an image is formed.

However, as explained above, the photopolymer type photosensitive planographic printing plate deteriorates in the bond strength between the photosensitive layer and substrate, so, as described in Japanese Patent Publication (A) No. 2003-57831, it has been proposed to provide an undercoat layer including a polyvinyl phosphoric acid between the photosensitive layer and substrate.

However, even if using such an undercoat layer, it was difficult to sufficiently secure bondability between the photosensitive layer and substrate.

DISCLOSURE OF THE INVENTION

The present invention was made in consideration of the above and has as its object the provision of a photopolymer type photosensitive planographic printing plate provided with a means for maintaining a good bondability between a photosensitive layer and substrate.

The object of the present invention is realized by a photosensitive planographic printing plate comprising a substrate and a photosensitive layer containing a photopolymerizable compound, wherein the photosensitive layer and the substrate are provided between them with an undercoat layer including a (co)polymer having structural units having ethylenically unsaturated groups bonded with silicon atoms and phosphonic acid groups.

As the structural units having ethylenically unsaturated groups bonded with silicon atoms, a group expressed by:

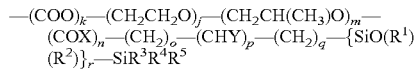

[where,
$R^1$ and $R^2$ respectively independently indicate groups selected from the group comprised of a hydroxy group, $C_1$ to $C_6$ alkoxy group, —CH=CH$_2$, and —OSiR$^3$R$^4$R$^5$,
$R^3$, $R^4$, and $R^5$ respectively independently indicate groups selected from the group comprised of a hydroxy group, $C_1$ to $C_6$ alkoxy group, and —CH=CH$_2$, however, at least one of $R^3$, $R^4$, and $R^5$ is —CH=CH$_2$, and X is a bivalent organic group selected from —CH$_2$—, —O—, —S—, and —NZ— (Z indicates H or a $C_1$ to $C_6$ alkyl group),
Y indicate a $C_1$ to $C_6$ alkyl group or a halogen atom,
k and n respectively independently indicate 0 or 1,
j and m respectively independently indicate integers of 0 to 500, and
o, p, q, and r respectively independently indicate integers of 0 to 5]

is preferable.

The phosphonic acid group is preferably expressed by

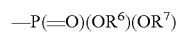

(where, $R^6$ and $R^7$ respectively independently indicate H or a $C_1$ to $C_6$ alkyl group).

The (co)polymer may further have a carboxylic acid group, carboxylic acid ester group, or amide group expressed by

(where, $R^8$ indicates a hydroxy group or $C_1$ to $C_6$ alkoxy group or —NH$_2$).

BEST MODE FOR WORKING THE INVENTION

In the photosensitive planographic printing plate of the present invention, the photosensitive layer and substrate are formed between them with an undercoat layer including a (co)polymer having structural units having ethylenically unsaturated groups bonded with silicon atoms and phosphonic acid groups. The ethylenically unsaturated groups are at the pendant positions with respect to the main chain of the (co)polymer and function as cross-linking parts.

As the structural units having ethylenically unsaturated groups bonded with silicon atoms, ones having the chemical structure

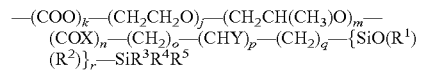

[where, $R^1$ and $R^2$ respectively independently indicate groups selected from the group comprised of a hydroxy group, $C_1$ to $C_6$ alkoxy group, —CH=CH$_2$, and —OSiR$^3$R$^4$R$^5$,
$R^3$, $R^4$, and $R^5$ respectively independently indicate groups selected from the group comprised of a hydroxy group, $C_1$ to $C_6$ alkoxy group, and —CH=CH$_2$, however at least one of $R^3$, $R^4$, and $R^5$ is —CH=CH$_2$ and X indicates a bivalent organic group selected from —CH$_2$—, —O—, —S—, and —NZ— (Z indicates H or a $C_1$ to $C_6$ alkyl group),
Y indicates a $C_1$ to $C_6$ alkyl group or a halogen atom,
k and n respectively independently indicate 0 or 1,
j and m respectively independently indicate an integer of 0 to 500, preferably 1 to 350, and
o, p, q, and r respectively independently indicate an integer of 0 to 5, preferably 0 or 1 to 2]

are suitable. The above halogen atom is any of a fluorine atom, chlorine atom, bromine atom, or iodine atom.

The phosphonic acid group is preferably a group expressed by

(where, $R^6$ and $R^7$ respectively independently indicate H or a $C_1$ to $C_6$ alkyl group).

Further, the (co)polymer may further have a carboxylic acid group, carboxylic acid ester group, or amide group expressed by

—COR$^8$ (where, R$^8$ indicates a hydroxy group, C$_1$ to C$_6$ alkoxy group, or —NH$_2$).

In the above chemical formulas, as the C$_1$ to C$_6$ alkyl group, a methyl group or ethyl group is preferable, in particular a methyl group is preferable. Further, as the C$_1$ to C$_6$ alkoxy group, a methoxy group or ethoxy group is preferable, in particular a methoxy group is preferable.

The above (co)polymer included in the undercoat layer may be easily synthesized by a method known in the technical field. For example, it can be easily synthesized by radical copolymerization between a monomer having an ethylenically unsaturated group bonded with a silicon atom and a monomer having a phosphonic acid group.

As the monomer having an ethylenically unsaturated group bonded with a silicon atom, for example, a (meth)acryl-based monomer and vinyl-based monomer of —(COO)$_k$—(CH$_2$CH$_2$O)$_j$—(CH$_2$CH(CH$_3$)O)$_m$—(COX)$_n$—(CH$_2$)$_o$—(CHY)$_p$—(CH$_2$)$_q$—{SiO(R$^1$)(R$^2$)}$_r$—SiR$^3$R$^4$R$^5$ (where,
R$^1$, R$^2$, R$^3$, R$^4$, R$^5$, X, and Y are as defined above,
R$^9$ indicates H or —CH$_3$,
k=1,
j, m, n, o, p, q, and r are as defined above) may be mentioned.

The (meth)acryl-based monomer may be synthesized by, for example, reacting a (meth)acrylic acid and polyol ester with an alkyl isocyanate having an alkoxysilyl group and condensation reacting the reaction product with vinyl alkoxysilane. The alkyl group of the alkyl isocyanate may be substituted by a halogen atom. Specifically, a condensate of a reaction product between hydroxyethyl(meth)acrylate or polyethyleneglycol (meth)acrylate and 3-isocyanate propyltrimethoxysilane with vinyl trimethoxysilane is preferable. Note that to promote the addition of the hydroxyethyl(meth) acrylate or polyethyleneglycol (meth)acrylate and 3-isocyanate propyltrimethoxysilane, use of dibutyltin dilaurate or another known catalyst is suitable. Further, to promote a condensation reaction of alkoxysilane, use of hydrochloric acid, sulfuric acid, phosphoric acid, acetic acid, malic acid, oxalic acid, or another known catalyst is suitable.

The vinyl-based monomer may, for example, be synthesized by condensing a plurality of molecules of alkoxyvinyl silane in water. As the condensation occurs mainly at the alkoxysilane positions, when using this monomer for polymerization by a radical addition polymerization reaction, insolubilization, that is, a so-called gelling reaction, is a concern in any solvent, but gelling can be prevented by selecting the solvent at the time of polymerization.

The monomer having a phosphonic acid group includes, for example, a vinyl phosphonic acid type monomer of

CH$_2$=CH—P(=O)(OR$^6$)(OR$^7$)

(where R$^6$ and R$^7$ are as defined above). As the vinyl phosphonic acid type monomer, a vinyl phosphonic acid is particularly preferable.

Further, in the (co)polymerization, in accordance with need, it is possible to further use a (meth)acryl-based monomer of

CH$_2$=C(R$^9$)—COR$^8$ (where R$^8$ and R$^9$ are as defined above) for radical copolymerization. As the (meth)acryl-based monomer, acrylic acid, methacrylic acid, methacrylamide, and acrylamide are particularly preferable.

The ratio of the amounts of use of the monomers is not particularly limited, but the ratio of the monomer having an ethylenically unsaturated group bonded with a silicon atom is preferably in the range of 0.05 to 50 mol %, more preferably 0.05 to 10 mol %, relative to a total amount of the monomers.

The solvent for the radical copolymerization is not particularly limited, but a nonaqueous solvent is preferable, particularly ethyl acetate is preferable.

The initiator of the radical copolymerization is not particularly limited. Azobisisobutyronitrile or another known initiator may be used.

The undercoat layer in the present invention includes the above obtained (co)polymer as a main ingredient. The ratio of the (co)polymer in the undercoat layer is preferably 80 to 100 mass % in range, more preferably 90 to 100 mass % in range, still more preferably 95 to 100 mass % in range.

The undercoat layer may be formed on the later explained substrate by various methods. As typical methods for formation of an undercoat layer, the following methods may be mentioned:

(1) A method of dissolving the above (co)polymer in water; methanol, ethanol, methyl ethyl ketone, or another organic solvent or a mixed solvent of the same; or a mixed solvent of any of these organic solvents and water and coating and drying the solution on a substrate to form an undercoat layer.

(2) A method of dissolving the above (co)polymer in water; methanol, ethanol, methyl ethyl ketone, or another organic solvent or a mixed solvent of the same; or a mixed solvent of any of these organic solvents and water, dipping a substrate in the solution, then rinsing the substrate or washing it by air etc., then drying it to form an undercoat layer.

In the method of (1), the (co)polymer solution of the concentration of 0.005 to 10 mass % may be coated by various methods. As the coating means, for example, bar coating, spin coating, spray coating, curtain coating, or another means may be used. Further, in the method of (2), the concentration of the solution is 0.005 to 10 mass %, preferably 0.01% to 4 mass %, the dipping temperature 30° C. to 80° C. is preferably 50 to 70° C., and the dipping time is 0.1 second to 5 minutes, preferably 3 seconds to 30 seconds.

The above solution can be adjusted in pH by ammonia, triethylamine, potassium hydroxide, or another basic substance, hydrochloric acid, phosphoric acid, sulfuric acid, nitric acid, or another inorganic acid, nitrobenzenesulfonic acid, naphthalenesulfonic acid, or another organic sulfonic acid, phenylphosphonic acid or another organic phosphonic acid, benzoic acid, fumaric acid, malic acid, or another organic carboxylic acid or other various organic acidic substances, naphthalenesulfonyl chloride, benzenesulfonyl chloride, or another organic chloride etc. and can be used at a pH=0 to 12, more preferably pH=0 to 6 in range. Further, to modify the tone reproducibility of the photosensitive planographic printing plate, it is possible to add a substance which absorbs ultraviolet light, visible light, infrared light, etc.

The amount of coating after drying of the undercoat layer in the present invention is suitably, in total, 1 to 100 mg/m$^2$, preferably 1.5 to 70 mg/m$^2$.

Next, the photosensitive planographic printing plate of the present invention will be explained in further detail. The photosensitive planographic printing plate of the present invention is provided with a photosensitive layer on the undercoat layer. The photosensitive layer must include a photopolymerizable compound. The photosensitive planographic printing plate of the present invention is a negative type.

[Photopolymerizable Compound]

The photopolymerizable compound included in the photosensitive layer in the present invention is not particularly limited, but preferably is a compound having addition polymerizable ethylenically unsaturated bonds. Such a compound may be selected from compounds having at least one, preferably two or more, photopolymerization terminals, that is, ethylenically unsaturated double bond groups. For example, it has the chemical form of a monomer, prepolymer, that is, a dimer, trimer, and oligomer or mixture of these and these copolymers or other chemical forms. As examples of the monomer and its copolymer, an ester of an unsaturated carboxylic acid (for example, acrylic acid, methacrylic acid, itaconic acid, crotonic acid, isocrotonic acid, maleic acid, etc.) and aliphatic polyhydric alcohol compound, an amide of an unsaturated carboxylic acid and aliphatic polyhydric amine compound, etc. may be mentioned.

As specific examples of a monomer of an ester of an aliphatic polyhydric alcohol compound and unsaturated carboxylic acid, as an acrylic acid ester, there are ethyleneglycol diacrylate, triethyleneglycol diacrylate, 1,3-butanediol diacrylate, tetramethyleneglycol diacrylate, propyleneglycol diacrylate, neopentylglycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethyleneglycol diacrylate, pentaerythritol diacrylate, pentaerythritol triacrylate, pentaerythritol tetracrylate, dipentaerythritol diacrylate, dipentaerythritol pentacrylate, dipentaerythritol hexacrylate, sorbitol triacrylate, sorbitol tetracrylate, sorbitol pentacrylate, sorbitol hexacrylate, tri(acryloyloxyethyl)isocyanurate, polyester acrylate oligomer, etc.

As the methacrylic acid ester, there are tetramethyleneglycol dimethacrylate, triethyleneglycol dimethacrylate, neopentylglycol dimethacrylate, trimethylolpropane trimethacrylate, trimethylolethane trimethacrylate, ethyleneglycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethyl methane, bis-[p-(methacryloxyethoxy)phenyl]dimethyl methane, etc.

As the itaconic acid ester, there are ethyleneglycol diitaconate, propyleneglycol diitaconate, 1,3-butanediol diitaconate, 1,4-butanediol diitaconate, tetramethyleneglycol diitaconate, pentaerythritol diitaconate, sorbitol tetraitaconate, etc.

As the crotonic acid ester, there are ethyleneglycol dicrotonate, tetramethyleneglycol dicrotonate, pentaerythritol dicrotonate, sorbitol tetradicrotonate, etc.

As the isocrotonic acid ester, there are ethyleneglycol diisocrotonate, pentaerythritol diisocrotonate, sorbitol tetraisocrotonate, etc.

As the maleic acid ester, there are ethyleneglycol dimaleate, triethyleneglycol dimaleate, pentaerythritol dimaleate, sorbitol tetramaleate, etc. Further, a mixture of the above-mentioned ester monomers may also be mentioned.

Further, as specific examples of a monomer of an amide of an aliphatic polyhydric amine compound and an unsaturated carboxylic acid, methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, xylylene bismethacrylamide, etc. may be mentioned.

As another example, a vinyl urethane compound containing two or more polymerizable vinyl groups in a molecule obtained by adding an ester of the above unsaturated carboxylic acid and aliphatic polyhydric alcohol compound or a vinyl monomer containing a hydroxyl group of the following general formula (A) or (B) to a hexamethylene diisocyanate or another polyisocyanate compound having two or more isocyanate groups in a molecule may be mentioned.

$$CH_2=C(Q^1)COOCH_2CH(Q^2)OH \quad (A)$$

(where $Q^1$ and $Q^2$ independently indicate H or $CH_3$)

$$(CH_2=C(Q^1)COOCH_2)_a C(Q^2)_b (Q^3)_c \quad (B)$$

(where $Q^1$ and $Q^2$ independently indicate H or $CH_3$, while $Q^3$ indicates —$CH_2OH$. a and c respectively independently indicate an integer of 1 to 3, while b indicates an integer of 0 or 1 to 2. However, a+b+c=4).

Further, the urethane acrylate described in Japanese Patent Publication (A) No. 51-37193, the polyester acrylates, epoxy acrylates obtained by reacting an epoxy resin and (meth)acrylic acid, or other polyfunctional acrylate or methacrylate described in the publications of Japanese Patent Publication (A) No. 48-64183, Japanese Patent Publication (B) No. 49-43191, Japanese Patent Publication (B) No. 52-30490 may be mentioned. Further, the compounds introduced as photocuring monomers and oligomers in the *Journal of the Adhesion Society of Japan*, vol. 20, no. 7, pp. 300 to 308 (1984) may be used.

Specifically, NK Oligo U-4HA, U-4H, U-6HA, U-108A, U-1084A, U-200AX, U-122A, U-340A, U-324A, UA-100 (the above made by Shin-Nakamura Chemical), UA-306H, AI-600, UA-101T, UA-101I, UA-306T, UA-306I (the above made by Kyoeisha Yushi), Art Resin UN-9200A, UN-3320HA, UN-3320HB, UN-3320HC, SH-380G, SH-500, SH-9832 (the above made by Negamu Chemical Industrial, etc. may be mentioned.

Note that the used amount of each of these photopolymerizable compounds is preferably 5 to 90 mass % of the photosensitive layer, more preferably 10 to 80 mass % in range.

The photosensitive layer in the present invention preferably includes, in addition to the above photopolymerizable compound, (a) an infrared absorbent,
(b) a photopolymerization initiator, and
(c) a binder resin.

[Infrared Absorbent]

The (a) infrared absorbent is a substance having a maximum absorption wavelength in the near infrared to infrared ray region, specifically a substance having a maximum absorption wavelength in the 760 nm to 1200 nm region. As such a substance, for example, various pigments or dyes may be mentioned.

As the pigment used in the present invention, commercially available pigments and the pigments described in the color index handbooks "Latest Pigment Handbook, Nihon Ganryo Gijutsu Kyokai ed., 1977", "Latest Pigment Application Technology" (CMC Publishing, 1986), "Printing Ink Technology" (CMC Publishing, 1984), etc. may be utilized. As the types of the pigments, a black pigment, yellow pigment, orange pigment, brown pigment, red pigment, violet pigment, blue pigment, green pigment, fluorescent pigment, or other polymer bonded color material etc. may be mentioned. Specifically, an insoluble azo pigment, azo lake pigment, condensed azo pigment, chelate azo pigment, phthalocyanine-based pigment, anthraquinone-based pigment, perylene and perynone-based pigment, thioindigo-based pigment, quinacridone-based pigment, dioxazine-based pigment, isoindolenone-based pigment, quinophthalone-based pigment, dye lake pigment, azine pigment, nitroso pigment, nitro pigment, natural pigment, fluorescent pigment, inorganic pigment, carbon black, etc. may be used.

Among these, in particular, as a substance efficiently absorbing light of the near infrared to infrared ray region and superior economically, carbon black is preferable. Further, as this carbon black, graft carbon black with good dispersibility having various functional groups is commercially available. For example, those described in "Carbon Black Handbook Third Edition" (Carbon Black Association ed., 1995), p. 167, "Carbon Black Characteristics and Optimum Formulation and Usage Technology" (Technical Information Institute, 1997), p. 111, etc. may be mentioned. All of these may be suitably used in the present invention.

These pigments may be used without surface treatment or may be used with known surface treatment. As known surface treatment methods, the method of surface coating by a resin or wax, the method of depositing a surfactant, the method of bonding a silane coupling agent or epoxy compound, polyisocyanate, or other reactive substance to the pigment surface, etc. may be mentioned. These surface treatment methods are described in "Properties and Application of Metal Soap" (Saiwai Shobo), "Latest Pigment Application Technology" (CMC Publishing, 1986), "Printing Ink Technology" (CMC Publishing, 1984).

The pigment used in the present invention preferably has a particle size of 0.01 to 15 micrometers in range, more preferably 0.01 to 5 micrometers in range.

As the dye used in the present invention, known commonly used ones may be used. For example, ones described in "Dye Handbook" (The Society of Synthetic Organic Chemistry, Japan ed., 1970), "Coloring Matter Engineering Handbook" (Japan Society of Colour Material ed., Asakura Shoten, 1989), "Technology and Market for Industrial Colors" (CMC, 1983), "Chemical Handbook—Applied Chemistry Section" (Japan Chemical Industry Association ed., Maruzen Shoten, 1986) may be mentioned. More specifically, an azo dye, metal chain chloroazo dye, pyrazolone azo dye, anthraquinone dye, phthalocyanine dye, carbonium dye, quinoneimine dye, methine dye, cyanine dye, indigo dye, quinoline dye, nitro-based dye, xanthene-based dye, thiazine-based dye, azine dye, oxazine dye, or other dye may be mentioned.

Further, as a dye efficiently absorbing near infrared or infrared rays, for example, cyanine dye, methine dye, naphthoquinone dye, squarilium dye, aryl benzo(thio)pyridinium salt, trimethine thiapyrylium salt, pyrylium-based compound, pentamethine thiopyrylium salt, infrared absorbing dye, etc. may be mentioned.

Among these, as an infrared absorbent, to make the later mentioned photopolymerization initiator efficiently manifest a polymerization function, a near infrared absorbing cationic dye of the following formula is preferable.

$$D^+A^-$$

(where, $D^+$ indicates a cationic dye having absorption in the near infrared region, and $A^-$ indicates an anion).

As the cationic dye having absorption in the near infrared region, one having absorption in the near infrared region such as a cyanine-based dye, triaryl methane-based dye, aminium-based dye, diinmonium-based dye, etc. may be mentioned. As specific examples of cationic dyes having absorption in the near infrared region, the following ones may be mentioned.

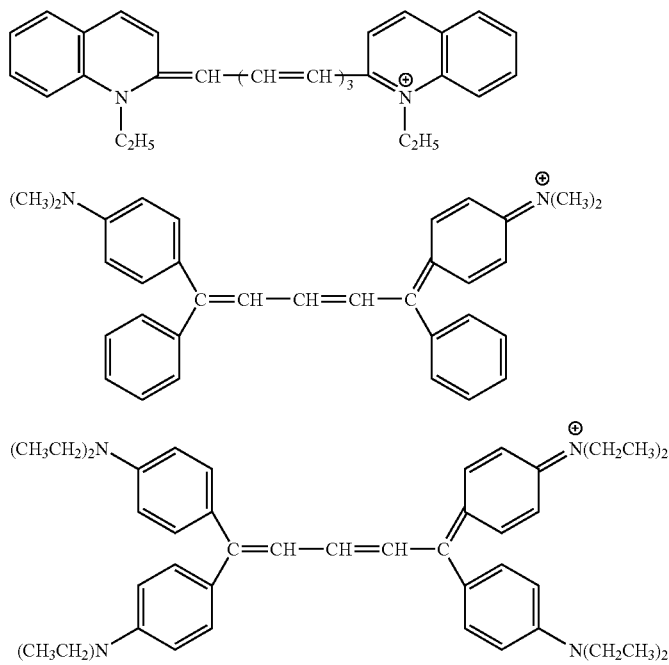

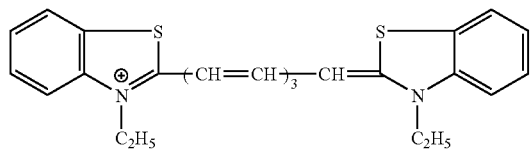
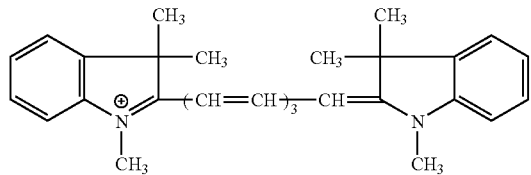
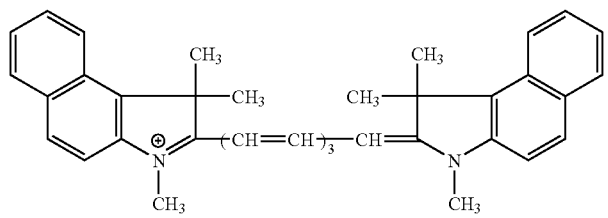
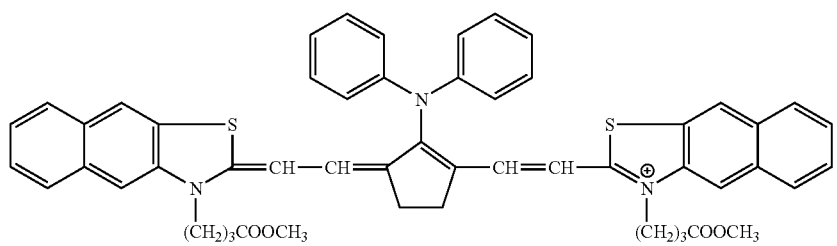
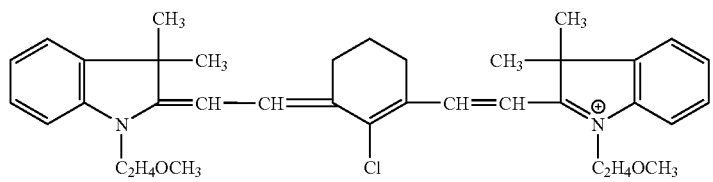
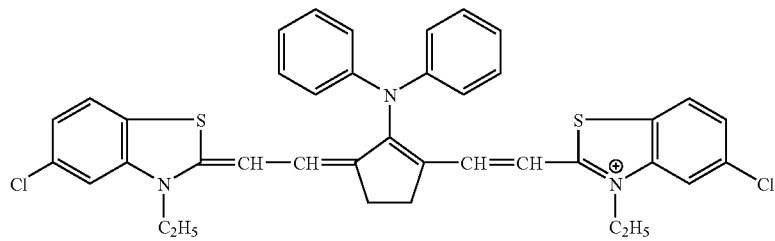
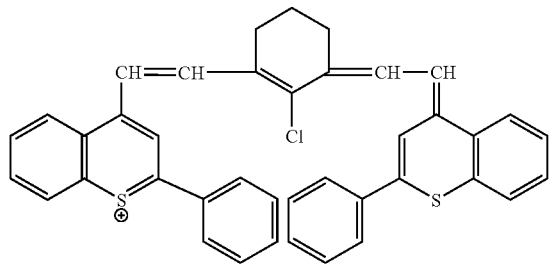

-continued

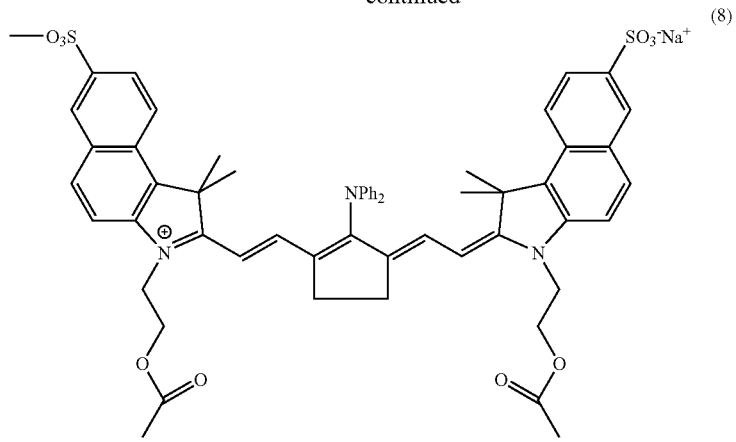
(8)

As the anions, halogen anions, $ClO_4^-$, $PF_6^-$, $BF_4^-$, $SbF_6^-$, $CH_3SO_3^-$, $CF_3SO_3^-$, $C_6H_5SO_3^-$, $CH_3C_6H_4SO_3^-$, $HOC_6H_4SO_3^-$, $ClC_6H_4SO_3^-$, boron anions of the following formula (3), etc. may be mentioned. As the boron anions, triphenyl n-butyl boron anions and trinaphthyl n-butyl boron anions are preferable.

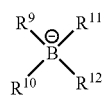
(3)

(where, $R^9$, $R^{10}$, $R^{11}$, and $R^{12}$ respectively independently indicate an alkyl group, aryl group, alkaryl group, allyl group, aralkyl group, alkenyl group, alkynyl group, alicyclic group, or saturated or unsaturated heterocyclic group, at least one of $R^9$, $R^{10}$, $R^{11}$, and $R^{12}$ being a $C_1$ to $C_8$ alkyl group).

Among these, as a cationic dye having absorption in the near infrared region, ones of the following formula (4) is preferable. These dyes have maximum absorption wavelengths of 817 to 822 nm, so the obtained photosensitive planographic printing plate is suitable for an exposure system mounting an existing near infrared semiconductor laser. Further, the molar absorption coefficient is $1 \times 10^5$ or more, so the obtained photosensitive planographic printing plate has a good sensitivity.

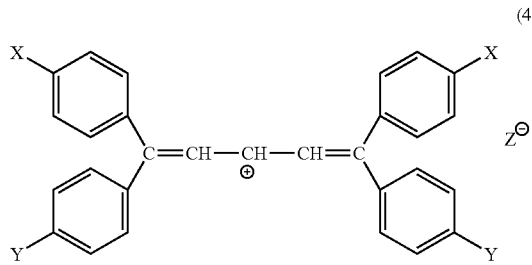
(4)

(where, X is $N(C_2H_5)_2$ or $N(CH_3)_2$, Y is $N(C_2H_5)_2$, H, or $OCH_3$, $Z^-$ is any anion of the following formula)

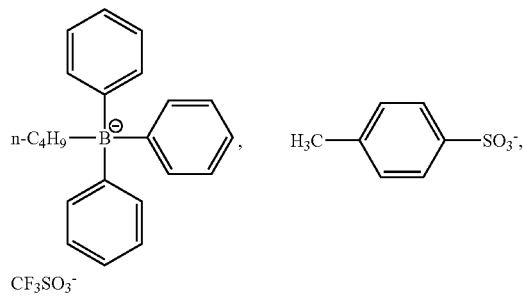

The infrared absorbent is at least one type of suitable pigment or dye able to absorb a specific wavelength of a later mentioned light source from the above pigment or dye and is used by addition to a photosensitive layer.

When using an infrared absorbent comprised of a pigment, the content of the pigment is preferably 0.5 to 15 mass % in range with respect to the total solid content of the photosensitive layer, particularly preferably 1 to 10 mass % in range. If the content of the pigment is less than 0.5 mass %, absorption of the infrared rays is insufficient, while if the content of the pigment is over 15 mass %, the amount of heat generated tends to become too great, so neither is preferred.

When using an infrared absorbent comprised of a dye, the content of the dye is preferably 0.5 to 15 mass % in range with respect to the total solid content of the photosensitive layer, particularly preferably 1 to 10 mass % in range. When the content of the dye is less than 0.5 mass %, the absorption of the infrared rays is insufficient, while if the content of the dye is over 15 mass %, the absorption of the infrared rays becomes substantially saturated and the effect of addition tends not to rise any further, so neither is preferable.

[Photopolymerization Initiator]

(b) As the photopolymerization initiator, it is possible to suitably select various photopolymerization initiators known by patent documents, nonpatent documents, etc. or a combined system of two or more types of photopolymerization initiators (photopolymerization initiation system) according to the wavelength of the light source used. Note that in the present invention, photopolymerization initiators used alone and combined systems of two or more types of photopolymerization initiators will be referred to all together as simply "photopolymerization initiators".

As the photopolymerization initiator, an organic boron compound, onium salt, and triazine-based compound are suitable. These photopolymerization initiators may be used alone or in combinations of two or more types.

The organic boron compound can function as a polymerization initiator by joint use with the above-mentioned infrared absorbent. As the organic boron compound, an ammonium salt of quaternary boron anions of the following formula (2) are suitable.

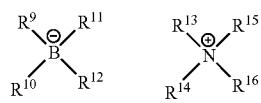

(2)

(where, $R^9$, $R^{10}$, $R^{11}$, and $R^{12}$ respectively independently indicate an alkyl group, aryl group, alkaryl group, allyl group, aralkyl group, alkenyl group, alkynyl group, alicyclic group, or saturated or unsaturated heterocyclic group, where at least one of $R^9$, $R^{10}$, $R^{11}$, and $R^{12}$ is a $C_1$ to $C_8$ alkyl group. Further, $R^{13}$, $R^{14}$, $R^{15}$, and $R^{16}$ respectively independently indicate an hydrogen atom, alkyl group, aryl group, allyl group, alkaryl group, aralkyl group, alkenyl group, alkynyl group, alicyclic group, or saturated or unsaturated heterocyclic group).

Among these, since a polymerization function can be efficiently exhibited, tetra n-butylammonium triphenyl borate, tetra n-butylammonium trinaphthyl borate, tetra n-butylammonium tri(p-t-butylphenyl)borate, tetramethylammonium n-butyltriphenyl borate, tetramethylammonium n-butyltrinaphthyl borate, tetramethylammonium n-octyltriphenyl borate, tetramethylammonium n-octyltrinaphthyl borate, tetraethylammonium n-butyltriphenyl borate, tetraethylammonium n-butyltrinaphthyl borate, trimethyl hydrogen ammonium n-butyltriphenyl borate, triethyl hydrogen ammonium n-butyltriphenyl borate, tetrahydrogen ammonium n-butyltriphenyl borate, tetramethylammonium tetra n-butyl borate, tetraethylammonium tetra n-butyl borate, etc. are preferably used.

The above organic boron compounds may be used jointly with the above-mentioned infrared absorbents (for example, $D^+A^-$) to generate radicals (R.) as shown in the following formula (5) by irradiation of infrared rays and manifest a function as a polymerization initiator (where, Ph indicates a phenyl group, R indicates a $C_1$ to $C_8$ alkyl group, and $X^+$ indicates an ammonium ion)

(5)

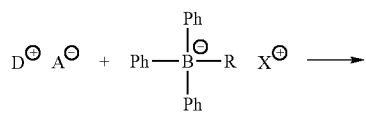

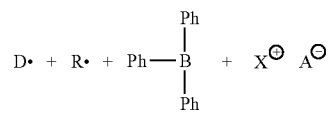

The content of the organic boron compound is preferably 0.1 to 15 mass % in range with respect to the solid content of the photosensitive layer, particularly preferably 0.5 to 7 mass % in range. If the content of the organic boron compound is less than 0.1 mass %, the polymerization reaction becomes insufficient, the curing becomes insufficient, and the image parts of the obtained negative type photosensitive planographic printing plate become weak, while if the content of the organic boron compound exceeds 15 mass %, the polymerization reaction will not efficiently occur. Further, in accordance with need, two or more types of (B) organic boron compounds may be jointly used.

An onium salt is a salt comprised of cations having at least one onium ion atom in a molecule and anions. As the onium ion atom in an onium salt, $S^+$ in sulfonium, $I^+$ in iodonium, $N^+$ in ammonium, $P^+$ atoms in phosphonium, etc. may be mentioned. Among these, as preferable onium ion atoms, $S^+$ and $I^+$ may be mentioned. As the structure of the onium salt, triphenylsulfonium, a derivative of that compound into the benzene ring of which an alkyl group, aryl group, etc. is introduced, and a derivative of that compound into the benzene ring of which an alkyl group, aryl group, etc. is introduced may be mentioned.

As the anion of the onium salt, a halogen anion, $ClO_4^-$, $PF_6^-$, $BF_4^-$, $SbF_6^-$, $CH_3SO_3^-$, $CF_3SO_3^-$, $C_6H_5SO_3^-$, $CH_3C_6H_4SO_3^-$, $HOC_6H_4SO_3^-$, $ClC_6H_4SO_3^-$, a boron anion of the above formula (3), etc. may be mentioned.

As the onium salt, from the viewpoint of the sensitivity and storage stability, a combination of an onium salt having $S^+$ in its molecule and an onium salt having $I^+$ in its molecule is preferable. Further, as the onium salt, from the viewpoint of the sensitivity and storage stability, a polyvalent onium salt having two or more onium ion atoms in its molecule is preferable. Here, the two or more onium ion atoms in the cation are connected by covalent bonds. Among the polyvalent onium salts, one having two or more types of onium ions atoms in its molecule is preferable, while one having $S^+$ and $I^+$ in its molecule is more preferable. In particular, as a polyvalent onium salt, ones of the following formulas (6) and (7) are preferable.

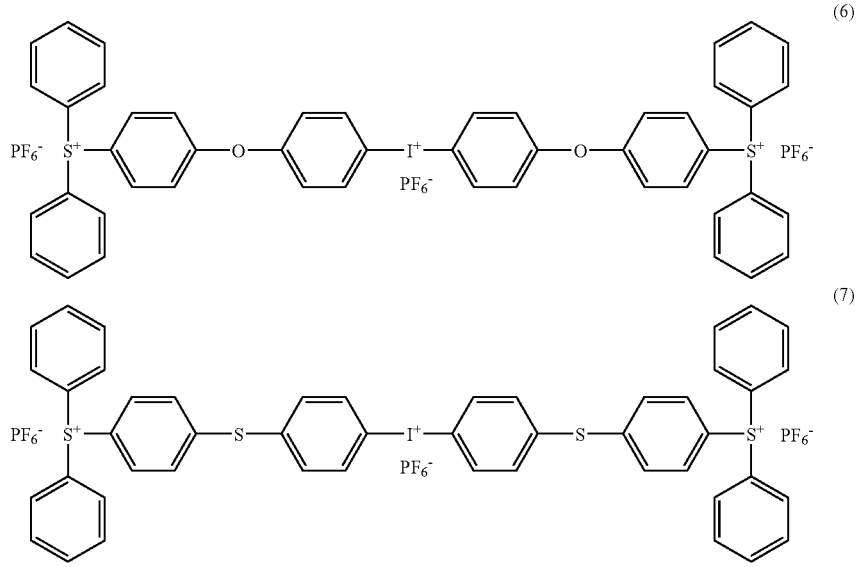

The content of the onium salt is preferably 0.1 to 15 mass % in range with respect to the solid content of the photosensitive layer, particularly preferably 0.5 to 7 mass % in range. If the content of the onium salt is less than 0.1 mass %, the polymerization reaction becomes insufficient and the obtained negative type photosensitive planographic printing plate is liable to become insufficient in sensitivity and printing resistance, while if the content of the onium salt exceeds 15 mass %, the obtained negative type photosensitive planographic printing plate becomes poor in developability. Further, in accordance with need, two or more types of onium salts may be jointly used. Further, a polyvalent onium salt and a monovalent onium salt may be jointly used.

A triazine-based compound is a known polymerization initiator used for radical polymerization. For example, bis(trihalomethyl)-s-triazine etc. may be suitably used as a photopolymerization initiator.

The amount blended of the triazine-based compound is usually slight. Further, when unsuitably large, the effective light rays are blocked, it crystallizes and reprecipitates in the photosensitive layer after coating, or other undesirable results occur. The content of the triazine-based compound is preferably 0.1 to 15 mass % in range with respect to the solid content of the photosensitive layer. In particular, a good result is obtained with 0.5 to 7 mass %.

Further, the photopolymerization initiator may also have added to it mercapto-3-triazole or another mercapto compound, an amine compound, or any other promoter.

[Binder Resin]

(c) As the binder resin, when using an alkali developer, an organic high molecular weight polymer soluble or swellable in alkali ion water is used. As the organic high molecular weight polymer soluble or swellable in alkali ion water, various ones may be mentioned, but ones having an alkali soluble group (acid group) in the main chain or side chain are preferable. As the acid group, an acid group of pKa 0 to 12 or less is preferable. In particular, a carboxylic acid group, phenolic hydroxy group, sulfonamide group, N-sulfonyl carbamoyl group, N-acylcarbamoyl group, or other such active amino or imino group is more preferable. As such an organic high molecular weight polymer, an addition polymer having a carboxylic acid group in the side chain, for example, ones described in the publications of Japanese Patent Publication (A) No. 59-44615, Japanese Patent Publication (B) No. 54-34327, Japanese Patent Publication (B) No. 58-12577, Japanese Patent Publication (B) No. 54-25957, Japanese Patent Publication (A) No. 54-92723, Japanese Patent Publication (A) No. 59-53836, and Japanese Patent Publication (A) No. 59-71048, that is, a methacrylic acid copolymer, acrylic acid copolymer, itaconic acid copolymer, crotonic acid copolymer, maleic acid copolymer, partially esterified maleic acid copolymer, etc., an acidic cellulose derivative having a carboxylic acid group in its side chain, an addition polymer having a hydroxy group to which a cyclic acid anhydride is added, a polyvinyl pyrrolidone, polyethylene oxide, and an alcohol soluble polyamide able to raise the strength of the cured coating, a polyether of 2,2-bis-(4-hydroxyphenyl)-propane and epichlorohydrin, etc. may be mentioned. Among these, [benzyl(meth)acrylate/(meth)acrylic acid/in accordance with need, another addition polymerizable vinyl monomer] copolymer and [allyl(meth)acrylate/(meth)acrylic acid/ in accordance with need, and other addition polymerizable vinyl monomer] copolymers are particularly preferable. Further, the polyurethane resins described in the publications of Japanese Patent Publication (B) No. 7-120040, Japanese Patent Publication (B) No. 7-120041, Japanese Patent Publication (B) No. 7-120042, Japanese Patent Publication (B) No. 8-12424, Japanese Patent Publication (A) No. 63-287944, Japanese Patent Publication (A) No. 63-287947, Japanese Patent Publication (A) No. 1-271741, and Japanese Patent Publication (A) No. 11-352691 may also be used for the applications of the present invention.

These high molecular weight polymers may improve the strength of the coating comprised of the binder resin by introduction of a radical reactive group into the side chain. As a functional group enabling an addition polymerization reaction, an ethylenically unsaturated bond group, amino group, epoxy group, etc. may be mentioned. Further, as a functional group able to form a radical by irradiation by light, a mercapto group, thiol group, halogen atom, triazine structure, onium salt structure, etc. may be mentioned, while as a polar group, a carboxyl group, imide group, etc. may be mentioned. As a functional group enabling an addition polymerization reactive, an acryl group, methacryl group, allyl group, styryl group, or other ethylenically unsaturated bond group is particularly preferable, but a functional group selected from an amino group, hydroxy group, phosphonic acid group, phosphoric acid group, carbamoyl group, isocyanate group, ureido group, ureylene group, sulfonic acid group, or ammonio group may also be used.

To maintain the developability of the photosensitive planographic printing plate, the binder resin used preferably has a suitable molecular weight and acid value. A high molecular weight polymer having a weight average molecular weight of 5,000 to 300,000 and an acid value of 20 to 200 (KOH mg/g-resin) is particularly preferable. The binder resin may be contained in the photosensitive layer in any amount, but if over 90 mass %, sometimes results are obtained which are not preferable in terms of the strength of the image formed using the layer or other respects, so the amount is preferably 10 to 90 mass %, more preferably 30 to 80 mass %. Further, the ratio of use of the photopolymerizable compound and binder resin is preferably, by weight ratio, 1/9 to 9/1 in range, more preferably 2/8 to 8/2, most preferably 3/7 to 7/3.

By loading the plate in a printer as it is without development after formation of an image and supplying a wetting solution and ink while turning the cylinder, in the case of a high molecular weight polymer of a type developed on a machine removing the non-image parts of the printing master or a type developed using a neutral developer after formation of the image, a graft polymer having an alkylene oxide chain at its side chain or a block copolymer having an alkylenoxide chain at its main chain is preferably used. As the alkylene oxide chain, a polyoxyethylene unit or polyoxyethylene-polyoxypropylene unit is preferable. For example, a copolymer of a polyethyleneglycol monomethacrylate or another unsaturated group-containing compound may be mentioned.

To maintain the developability of the photosensitive planographic printing plate, the binder resin used is particularly preferably a high molecular weight polymer having a weight average molecular weight of 5,000 to 300,000 and a number average molecular weight of the alkylene oxide unit of 500 to 10,000. The binder resin may be included in any amount in a photosensitive layer, but when over 90 mass %, sometimes results preferable from the viewpoint of the strength of the image formed using the layer etc. are not obtained, so preferably the amount is made 10 to 90 mass %, more preferably 30 to 80 mass %. Further, the ratio of use of the photopolymerizable compound and binder resin is, by weight ratio, preferably 1/9 to 9/1 in range, more preferably 2/8 to 8/2, most preferably 3/7 to 7/3.

In the photosensitive layer in the present invention, further, to prevent unnecessary heat polymerization of the photopolymerizable compound during formation or storage of the photosensitive layer, it is desirable to add a small amount of a heat polymerization inhibitor. As a preferable heat polymerization inhibitor, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenyl hydroxylamine cerous salt, N-nitrosophenyl hydroxylamine aluminum salt, etc. may be mentioned. The amount of addition of this type of heat polymerization inhibitor is preferably about 0.01 mass % to about 5 mass % of the total ingredients of the photosensitive layer. Further, in accordance with need, to prevent inhibition of polymerization by oxygen, a behenic acid or behenic acid amide or other such higher fatty acid derivative etc. may be added and made to concentrate at the surface of the photopolymerizable photosensitive layer in the processing of drying after coating. The amount of addition of the higher fatty acid derivatives is preferably of 0.5 to 10 mass % of the total ingredients of the photosensitive layer.

Further, it is also possible to add a coloring agent for the purpose of coloring the photosensitive layer. As the coloring agent, for example, there are a phthalocyanine-based pigment (C. I. Pigment Blue 15:3, 15:4, 15:6, etc.), azo-based pigment, carbon black, titanium oxide, or other pigment, Ethyl Violet, Crystal Violet, azo dye, anthraquinone-based dye, and cyanine-based dye. The amount of addition of the dye and pigment is preferably about 0.5 mass % to about 5 mass % of the total ingredients of the photosensitive layer.

In addition, to improve the physical properties of the cured coating obtained from the photosensitive layer, an inorganic filler or dioctyl phthalate, dimethyl phthalate, tricresyl phosphate, or another plasticizer, or other additive may also be added. Further, a known surfactant may also be added for the purpose of improving the coatability of the coated surface. As a known surfactant, there are a fluorine-based surfactant, polyoxyalkylene-based nonionic surfactant, dialkylsiloxane, other silicone-based surfactant, etc.

As the inorganic filler, silica particles are preferable. Modified silica particles modified in surface characteristics are particularly preferable.

The silica particles are common ones in the technical field and have silicon dioxide ($SiO_2$) as their main ingredients. The silica particles usually have a particle size of 1 nm to 1000 nm, preferably 1 nm to 500 nm, more preferably 1 nm to 100 nm in range. The silica particles are commercially available. For example, Snowtex OL (20% colloid aqueous solution of silica of particle size of 45 nm) and MEK-ST (30% colloid methyl ethyl ketone solution of silica of particle size of 10 to 20 nm) made by Nissan Chemical, AEROSIL 130 made by Nippon Aerosil (silica of particle size of 16 nm), Mizukasil P-527U made by Mizusawa Industrial Chemicals (silica of particle size of 60 nm), etc. may be mentioned.

As the silica particles, there are fumed silica, precipitated silica, colloidal silica, or other forms, but among these, colloidal silica is preferably used.

The silica particles are preferably modified at their surfaces by an organic compound having at least one ethylenically unsaturated group, at least one hydrophilic site, and at least one silyloxy group and used as modified silica particles.

An ethylenically unsaturated group imparts reactivity with the photopolymerizable compound, while a silyloxy group imparts bondability with the silica particles. The ethylenically unsaturated group and the silyloxy group are preferably positioned at the two ends of the molecular chain of the organic compound. In this case, the hydrophilic site is present between the ethylenically unsaturated group and silyloxy group.

The hydrophilic site is not particularly limited, but a polyoxyalkylene chain is preferable. Any of a polyethylene chain, polypropylene chain, or polyethylene-polyoxypropylene chain is also possible, but a polyethylene chain is preferable.

As the organic compound, specifically, one having the following formula:

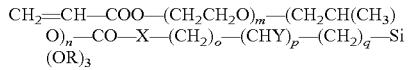

[where,
R is a $C_1$ to $C_6$ alkyl group, preferably a methyl group or ethyl group,
X is a bivalent organic group selected from —$CH_2$—, —O—, —S—, and —NZ— (Z indicates H or a $C_1$ to $C_6$ alkyl group), preferably H, Y is a $C_1$ to $C_6$ alkyl group or a halogen atom, preferably a methyl group or a fluorine atom, m is an integer of 0 to 100, preferably an integer of 1 to 50, n is an integer of 0 to 100, preferably an integer of 0 to 20, however, m+n is 1 or more, o is an integer of 0 to 10, preferably an integer of 1 to 10, p is an integer of 0 to 5, preferably an integer of 0 to 2, q is an integer of 0 to 10, preferably an integer of 1 to 10, however, o+q is 1 or more, preferably 2 or more) is preferable.

If reacting the organic compound of the above formula with silica particles, the silyloxy groups (—Si(OR)$_3$) react with the hydroxyl groups on the silica surface and covalent bonds, so the silica particles are modified on their surfaces. The ethylenically unsaturated groups bonded with the silica surface become sites reacting with a photopolymerizable compound.

The organic compound can be obtained by for example reaction between polyethyleneglycol acrylate and 3-isocyanatepropyl triethoxysilane. The organic compound obtained by the reaction has the following structure.

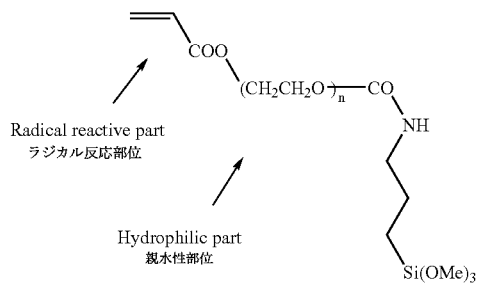

The surface modification of the silica particles by the organic compound may be performed for example by bringing the two into contact for a predetermined time or by another commonly used technique in the technical field. The modification rate of the surface of the silica particles is usually 50 to 99% in range, preferably 80 to 99%. The modification rate of the surface of the silica particles can be controlled by adjusting the weight ratio between the silica particles and the organic compound.

The organic compound has at least one ethylenically unsaturated group, so the bondability between the photosensitive layer including the silica particles modified by the organic compound and the photopolymerizable compound and the undercoat layer is further improved. Therefore, even if the photosensitive planographic printing plate provided with the photosensitive layer on a substrate via an undercoat layer is exposed and the photopolymerizable compound in the photosensitive layer cross-links and the photosensitive layer shrinks, good bonding of the substrate and photosensitive layer can be maintained.

The photosensitive layer in the photosensitive planographic printing plate of the present invention can be obtained by dissolving a photosensitive composition including a photopolymerizable compound in various types of organic solvents and coating the undercoat layer.

As the solvent able to be used here, there are acetone, methyl ethyl ketone, cyclohexane, ethyl acetate, ethylene dichloride, tetrahydrofuran, dimethyl ether, diethyl ether, toluene, ethyleneglycol monomethyl ether, ethyleneglycol monoethyl ether, ethyleneglycol dimethyl ether, propylene glycol monomethyl ether, propylene glycol monoethyl ether, acetylacetone, cyclohexanone, diacetone alcohol, ethyleneglycol monomethyl ether acetate, ethyleneglycol ethyl ether acetate, ethyleneglycol monoisopropyl ether, ethyleneglycol monobutyl ether acetate, 3-methoxypropanol, methoxymethoxyethanol, diethyleneglycol monomethyl ether, diethyleneglycol monoethyl ether, diethyleneglycol dimethyl ether, diethyleneglycol diethyl ether, propylene glycol monomethylether acetate, propylene glycol monoethyl ether acetate, 3-methoxypropylacetate, N,N-dimethyl formamide, dimethyl sulfoxide, γ-butyrolactone, methyl lactate, ethyl lactate, methanol, ethanol, propanol, butanol, water, etc. These solvents can be used alone or mixed. Further, the solid content concentration in the coating solution is suitably 1 to 50 mass %.

The amount of coating of the photosensitive layer in the photosensitive planographic printing plate of the present invention is, by weight of the coating after drying, suitably 0.1 to 10 g/m$^2$ in range, more preferably 0.3 to 5 g/m$^2$, further preferably 0.5 to 3 g/m$^2$.

The photosensitive planographic printing plate of the present invention is usually exposed in the atmosphere, so the photosensitive layer is further preferably provided with a protective layer. The protective layer prevents the entry into the photosensitive layer of oxygen or basic substances or other low molecule weight compounds present in the atmosphere inhibiting the polymerization reaction in the photosensitive layer and makes the exposure conditions in the atmosphere easier. The characteristics desired in this protective layer are a high barrier property of oxygen or other low molecule weight compounds, low barrier property of light used for exposure, superior bondability with the photosensitive layer, and easy removal at the time of development.

As the material of the protective layer, for example, water-soluble polymer compounds relatively excellent in crystallinity may be mentioned, specifically, polyvinyl alcohol, polyvinyl pyrrolidone, acidic celluloses, gelatin, gum arabic, polyacrylic acid, etc. Among these, if using polyvinyl alcohol as a main ingredient, the best results are given to basic characteristics such as the oxygen barrier property and removability at the time of development. The polyvinyl alcohol used for the protective layer may also be partially substituted by an ester, ether, and acetal so long as it includes unsubstituted vinyl alcohol units for giving the required oxygen barrier property and water-solubility. Further, similarly, it may partially have other copolymerization ingredients.

As specific examples of polyvinyl alcohol (PVA), ones which are hydrolyzed by 71 to 100% and having molecular weights of 300 to 2400 in range may be mentioned. Specifically, ones made by Kuraray such as PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, PVA-L8, etc. may be mentioned.

The ingredients (selection of type of PVA, use of additives, etc.), amount of coating, etc. of the protective layer are selected considering the oxygen barrier property and removability at the time of development and also the fogging, bondability, and scratch resistance. In general, the higher the PVA used in hydrolysis rate (the higher the protective layer in unsubstituted vinyl alcohol unit content) and the thicker the coating, the higher the oxygen barrier property and the more advantageous in terms of sensitivity. However, if extremely increasing the oxygen barrier property, an unnecessary polymerization reaction occurs at the time of production or storage and further unnecessary fogging and thickening of lines occurs at the time of exposure as problems. Further, the bondability with the image parts and the scratch resistance are extremely important in handing of the plates. That is, if laminating a hydrophilic layer comprised of a water-soluble polymer over a lipophilic polymerization layer, the insufficient bond strength causes the coating to easily peel off and the peeled off parts cause poor coating curing or other defects due to the oxygen inhibiting the polymerization. As a method for improving the bondability of two layers, the method may be mentioned of mixing an acryl-based emulsion or water insoluble vinyl pyrrolidone-vinyl acetate copolymer etc. in an amount of 20 to 60 mass % in a hydrophilic polymer mainly comprised of a polyvinyl alcohol.

[Substrate]

The substrate of the photosensitive planographic printing plate of the present invention may be any substrate so long as its surface is hydrophilic, but a dimensionally stable sheet like material is preferable. For example, paper, paper on which a plastic (for example, polyethylene, polypropylene, polystyrene, etc.) is laminated, a sheet such as aluminum (including an aluminum alloy), zinc, copper, or another metal or its alloy (for example, an alloy with silicon, copper, manganese, magnesium, chrome, zinc, lead, bismuth, or nickel), a film of for example cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, or other such plastic, paper or plastic film on which a metal or alloy is laminated or deposited, etc. may be mentioned. Among these substrates, an aluminum sheet is remarkably stable dimensionally and is inexpensive, so is particularly preferable. Further, a composite sheet comprised of a polyethylene terephthalate film on which an aluminum sheet is bonded such as described in Japanese Patent Publication (B) No. 48-18327 is preferable. Usually, the thickness is 0.05 mm to 1 mm or so.

Further, in the case of a substrate having a metal, in particular an aluminum, surface, the later explained grain treatment, dipping in an aqueous solution of sodium silicate, potassium fluorozirconate, a phosphate, etc., anodization, or other surface treatment is preferably performed.

[Grain Treatment]

The grain treatment method includes mechanical grain treatment, chemical etching, electrolytic grain treatment, etc. as disclosed in Japanese Patent Publication (A) No. 56-28893. Further, the electrochemical grain treatment method of electrochemical grain treatment in a hydrochloric acid or nitric acid electrolyte, the wire brush grain treatment method of scratching an aluminum surface by a metal wire, the ball grain method of grain treatment of an aluminum surface by polishing balls and a polishing agent, the brush grain method of grain treatment of a surface by a nylon brush and a polishing agent or other mechanical grain treatment method may be used. The above grain treatment methods may be used alone or in combination. Among these, the method creating the surface roughness useful in present invention is the electrochemical grain treatment method of electrochemical grain treatment in a hydrochloric acid or nitric acid electrolyte. The suitable current density is 100 to 400 $C/dm^2$ in range. More specifically, electrolysis in an electrolyte containing 0.1 to 50% of hydrochloric acid or nitric acid under conditions of a temperature of 20 to 100° C., a time of 1 second to 30 minutes, and a current density of 100 to 400 $C/dm^2$ is preferable.

This grain-treated aluminum substrate is chemically etched by an acid or alkali. When using an acid as the etching agent, destroying the microstructure takes time. This is disadvantageous when applying the present invention industrially. This can be improved by using an alkali as the etching agent.

As the preferably used alkali agent, caustic soda, sodium carbonate, sodium aluminate, sodium metasilicate, sodium phosphate, potassium hydroxide, lithium hydroxide etc. may be mentioned. The preferable ranges of the concentration and temperature are 1 to 50% and 20 to 100° C., while conditions where the amount of dissolution of the aluminum becomes 5 to 20 $g/m^3$ are preferable.

After etching, the plate is pickled to remove the smut remaining on the surface. As the acid used, nitric acid, sulfuric acid, phosphoric acid, chromic acid, fluoric acid, fluoroboric acid etc. may be mentioned. In particular, as a method of treatment for removal of smut after electrochemical roughening, preferably the method of bringing the plate into contact with 15 to 65 mass % of sulfuric acid at 50 to 90° C. in temperature as described in Japanese Patent Publication (A) No. 53-12739 and the method of alkali etching as described in Japanese Patent Publication (B) No. 48-28123 may be mentioned. Further, in the present invention, preferably the aluminum substrate has a surface roughness (Ra) of 0.3 to 0.7 μm.

[Anodization]

The above treated aluminum substrate is preferably further anodized. This anodizing treatment may be performed by a method conventionally used in this technical field. Specifically, sulfuric acid, phosphoric acid, chromic acid, oxalic acid, sulfamic acid, benzene sulfonic acid etc., or two or more of these combined may be used and a direct current or alternating current applied to aluminum in an aqueous solution or nonaqueous solution to form an anodized coating on the aluminum substrate surface. The conditions for the anodizing treatment differ depending on the electrolyte used, so cannot be determined across the board, but generally a concentration of the electrolyte of 1 to 80%, a solution temperature of 5 to 70° C., a current density of 0.5 to 60 ampere/$dm^2$, a voltage of 1 to 100V, and an electrolysis time of 10 to 100 seconds in range are suitable.

Among these anodizing treatments, particularly the method of anodizing treatment by a high current density in sulfuric acid described in the specification of British Patent No. 1,412,768 and the method of anodizing treatment using phosphoric acid as the electrolytic bath as described in the specification of U.S. Pat. No. 3,511,661 are preferable.

In the present invention, an anodic oxidation coating of 1 to 10 $g/m^2$ is preferable. If less than 1 $g/m^2$, the plate is easily scratched, while if over 10 $g/m^2$, a large amount of power is required for production thereby making this economically disadvantageous. Preferably, the coating is 1.5 to 7 $g/m^2$, more preferably 2 to 5 $g/m^2$.

Further, in the present invention, the substrate may also be treated to seal pores after grain treatment and anodizing treatment. This pore sealing treatment is performed by dipping the substrate in a hot aqueous solution containing hot water and an inorganic salt or organic salt, a steam bath, etc.

Further, in the present invention, the substrate is preferably treated by an alkali metal silicate after grain treatment and anodizing treatment. Due to this, the bondability between the undercoat layer and the substrate is further improved. The treatment by the alkali metal silicate referred to here means dipping the substrate in an alkali metal silicate aqueous solution for a predetermined time. In the treatment by the alkali metal silicate aqueous solution, the preferable treatment time is 1 second to 2 minutes, the preferable temperature of the alkali metal silicate aqueous solution is 40 to 90° C., and the preferable concentration of the alkali metal silicate aqueous solution is 1 g/l to 50 g/l. As the alkali metal silicate, for example, sodium silicate, potassium silicate, and lithium silicate may be mentioned.

In the present invention, the substrate (in the case of aluminum, aluminum suitably treated on its surface as explained above being preferable) is formed with the undercoat layer, then coated with a photosensitive layer comprised of the above ingredients, and, in accordance with need, further coated with a protective layer, whereby a photosensitive planographic printing plate is formed.

The thus obtained photosensitive planographic printing plate can be directly exposed by an Ar laser, a second harmonic of a semiconductor laser (SHG-LD, 350 to 600 nm), YAG-SHG laser, InGaN-based shortwave semiconductor laser, etc. to enable development, but to enable handling in a bright room, a high output laser having maximum strength in the near infrared to infrared ray region is preferably used. As such a laser having maximum strength in the near infrared to infrared ray region, various types of lasers having maximum strength in the 760 to 1200 nm wavelength region are used. Further, after image exposure and before development, it is possible to provide a heating process of 1 second to 5 minutes at a temperature of 50° C. to 150° C. for the purpose of improving the curing rate of the photopolymerizable photosensitive layer.

As the developer used in this development, a conventionally known alkali aqueous solution can be used. For example, sodium silicate, potassium silicate, sodium triphosphate, potassium triphosphate, ammonium triphosphate, sodium diphosphate, potassium diphosphate, ammonium diphosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, lithium hydroxide, or another inorganic alkali agent may be mentioned. Further, monomethyl amine, dimethyl amine, trimethyl amine, monoethyl amine, diethyl amine, triethyl amine, monoisopropyl amine, diisopropyl amine, triisopropyl amine, n-butyl amine, monoethanol amine, diethanol amine, triethanol amine, monoisopropanol amine, diisopropanol amine, ethylene imine, ethylene diamine, pyridine, or another organic alkali agent may be jointly used. These alkali agents may be used alone or in combination.

Further, the developer may also have the following other surfactants added to it. As the other surfactants, for example, polyoxyethylenelauryl ether, polyoxyethylene cetyl ether, polyoxyethylenestearyl ether or other polyoxyethylenealkyl ethers, polyoxyethyleneoctylphenyl ether, polyoxyethylenenonylphenyl ether or other polyoxyethylenealkylaryl ethers, polyoxyethylenestearate or other polyoxyethylenealkyl esters, sorbitan monolaurate, sorbitan monostearate, sorbitan distearate, sorbitan monooleate, sorbitan sesquioleate, sorbitan trioleate or other sorbitan alkyl esters, glycerol monostearate, glycerol monooleate or other monoglyceride alkyl esters or other nonionic surfactant; sodium dodecyl benzene sulfonate or other alkylbenzene sulfonic acid salts, sodium butylnaphthylene sulfonate, sodium pentylnaphthylene sulfonate, sodium hexylnaphthylene sulfonate, sodium octylnaphthylene sulfonate, or other alkylnaphthylene sulfonic acid salts, sodium lauryl sulfate or other alkyl sulfuric acid salts, sodium dodecyl sulfonate or other alkylsulfonic acid salts, sodium dilauryl sulfosuccinate, or other sulfosuccinic acid ester salts or other anion surfactant; lauryl betaine, stearyl betaine or other alkyl betaines, amino acids or other bipolar surfactant may be used, but the particularly preferable ones are alkylnaphthylene sulfonic acid salts or other anion surfactants, alkyl betaines, and nonionic surfactants having polyoxyalkylene ether groups of the formula (1).

$$R^1—O—(R^2—O)_nH \quad (1)$$

{where, in formula (1), $R^1$ indicates a substitutable $C_3$ to $C_{15}$ alkyl group, substitutable $C_6$ to $C_{15}$ aromatic hydrocarbon group, or substitutable $C_4$ to $C_{15}$ hetero aromatic cyclic group (as the substituent group, a $C_1$ to $C_{20}$ alkyl group, Br, Cl, I, or other halogen atom, $C_6$ to $C_{15}$ aromatic hydrocarbon group, $C_7$ to $C_{17}$ aralkyl group, $C_1$ to $C_{20}$ alkoxy group, $C_2$ to $C_{20}$ alkoxycarbonyl group, or $C_2$ to $C_{15}$ acyl group may be mentioned), $R^2$ indicates a substitutable $C_1$ to $C_{10}$ alkylene group (as the substituent group, a $C_1$ to $C_{20}$ alkyl group or $C_6$ to $C_{15}$ aromatic hydrocarbon group may be mentioned), and n indicates an integer of 1 to 100}. Further, if the part of $(R^2—O)_n$ of formula (1) is in the above range, two types or three types of groups are also possible. Specifically, an ethylenoxy group and propylenoxy group, ethyleneoxy group and isopropyloxy group, ethyleneoxy group and butyleneoxy group, ethylenoxy group and isobutylene group, or other combinations connected in a random or block form may be mentioned.

These surfactants may be used alone or in combination. Further, the content of these surfactants in the developer is preferably, converted to active ingredient, 0.1 to 20 mass %.

In the present invention, the developer may also contain, in addition to the above ingredients in accordance with need, the following ingredients. For example, benzoic acid, phthalic acid, p-ethyl benzoic acid, p-n-propylbenzoic acid, p-isopropylbenzoic acid, p-n-butylbenzoic acid, p-t-butylbenzoic acid, p-2-hydroxyethyl benzoic acid, decanoic acid, salicylic acid, 3-hydroxy-2-naphthoic acid or other organic carboxylic acid; isopropyl alcohol, benzyl alcohol, ethyl cellosolve, butyl cellosolve, phenyl cellosolve, propylene glycol, diacetone alcohol, or another organic solvent; and also a chelating agent, reducing agent, dye, pigment, hard water softener, preservative, defoamer, etc. may be mentioned.

The photosensitive planographic printing plate of the present invention is developed by the developer in accordance with an ordinary method at 0 to 60° C., preferably 15 to 40° C. or so in temperature, for example, the exposed planographic printing plate is dipped in a developer and brushed. Further, an automatic developing machine may be used for development. In this case, the developer becomes worn out in accordance with the amount of treatment, so a refill solution or fresh developer may be used to restore the treatment capability. Note that when providing a protective layer on the photosensitive layer, the developer may be used to remove the protective layer and remove unexposed parts of the photosensitive layer simultaneously or cold water or warm water may be used to first remove the protective layer, then the unexposed parts of the photosensitive layer may be removed by the developer. The cold water or warm water may contain, for example, a preservative desired in Japanese Patent Publication (A) No. 10-10754, an organic solvent described in Japanese Patent Publication (A) No. 8-278636, etc.

The thus developed photosensitive planographic printing plate is preferably, as described in Japanese Patent Publication (A) No. 54-8002, No. 55-115045, No. 59-58431, or other publications, post-treated by rinsing water, a rinse solution containing a surfactant etc., or a desensitization solution containing gum arabic, a starch derivative, etc. The photosensitive planographic printing plate of the present invention may be post-treated by using these treatments in various combinations.

Further, considering the recent environmental issues, it is also possible to use "water" with a pH in a neutral region for development. In this case as well, the above-mentioned other surfactant meant to improve the developability or the rinsing water, a rinse solution containing a surfactant etc., or a desensitization solution containing gum arabic, a starch derivative, etc. meant to desensitize the plate surface after development may be added to the developer.

The printing plate obtained by the above treatment may be subjected to a well-known post-exposure treatment or heat treatment such as burning, so as to improve the printing resistance. Next, the above treated planographic printing plate is set in an offset printer and used for printing a large number of sheets.

Further, the obtained photosensitive planographic printing plate may also be used for a plate called an "on-machine development type" where the obtained photosensitive planographic printing plate can be exposed with the image and attached as it is to the printer plate cylinder to start printing.

EXAMPLES

Below, examples will be used to explain the present invention in further detail, but the present invention is not limited to the scope of these examples.

1. Synthesis of Condensate Having Silane Group

Synthesis Example 1

[Synthesis of Condensate 1 Having Vinylsilane Group]
A 500 ml reaction flask was charged with 63 g of hydroxyethyl methacrylate (hereinafter referred to as "HEMA", made by Tokyo Chemical Industry) and 0.5 g of dibutyltin dilaurate. The HEMA was mechanically stirred at room temperature and, while doing so, 10 g of 3-isocyanate propyltrimethoxysilane (Y-5187 made by Union Carbide) was added dropwise by a drop funnel. After 6 hours, no isocyanate groups could be confirmed in the IR spectrum. Next, the reaction mixture was heated by a heater to 70° C. Phosphoric acid in an amount of 2 g and distilled water in an amount of 20 g were added, further, 106.8 g of vinyl trimethoxysilane (hereinafter referred to as "VTMS", made by Tokyo Chemical Industry) was added dropwise into the flask, the mixture was stirred for 4 hours, then the contents were taken out from the flask.

Synthesis Example 2

[Synthesis of Condensate 2 Having Vinylsilane Group]
A 500 ml reaction flask was charged with 210 g of polyethyleneglycol methacrylate (hereinafter referred to as "PEGMA", made by NOF Corporation, PE-350) and 0.5 g of dibutyltin dilaurate. The PEGMA was mechanically stirred at room temperature and, while doing so, 10 g of 3-isocyanate propyltrimethoxysilane (Y-5187 made by Union Carbide) was added dropwise by a drop funnel. After 6 hours, no isocyanate groups could be confirmed in the IR spectrum. Next, the reaction mixture was heated by a heater to 70° C. Phosphoric acid in an amount of 2 g and distilled water in an amount of 20 g were added, further, 106.8 g of VTMS was added dropwise into the flask, the mixture was stirred for 4 hours, then the contents were taken out from the flask.

Synthesis Example 3

[Synthesis of Condensate 3 Having Vinylsilane Group]
A 200 ml reaction flask was charged with 1 g of phosphoric acid, 60 g of methanol, and 8 g of distilled water. The mixture was mechanically stirred at room temperature and, while doing so, 20 g of VTMS was added dropwise by a drop funnel into the flask. The mixture was stirred for 13 hours, then the contents were taken out from the flask.

2. Synthesis of Silane-Containing Polymer

Synthesis Example 4

[Synthesis of Vinyl Silane Polymer 1]
90 g of ethyl acetate was introduced into a 200 ml capacity four-necked flask under a nitrogen atmosphere, mechanically stirred, and heated to 70° C. A preliminary mixture of 33.3 g of VPA, 3 g of the condensate 1 obtained at Synthesis Example 1, 0.36 g of azobisisobutyronitrile, and 25 g of ethyl acetate was added dropwise at 70° C. over 4 hours. After the end of the drop addition, the mixture was heated at 70° C. for at least 2 hours. As the reaction proceeds, the polymer precipitated. The reaction mixture was filtered and washed by ethyl acetate. After drying, a white polymer precipitate was obtained. The iodine value (g ($I_2$)/100 g (polymer)) was 3.9.

Synthesis Example 5

[Synthesis of Vinyl Silane Polymer 2]
90 g of ethyl acetate was introduced into a 200 ml capacity four-necked flask under a nitrogen atmosphere, mechanically stirred, and heated to 70° C. A preliminary mixture of 30.3 g of VPA, 6.6 g of the condensate 2 obtained at Synthesis Example 2, 0.36 g of azobisisobutyronitrile, and 25 g of ethyl acetate was added dropwise at 70° C. over 4 hours. After the end of the drop addition, the mixture was heated at 70° C. for at least 2 hours. As the reaction proceeds, the polymer precipitated. The reaction mixture was filtered and washed by ethyl acetate. After drying, a white polymer precipitate was obtained. The iodine value (g ($I_2$)/100 g (polymer)) was 4.7.

Synthesis Example 6

[Synthesis of Vinyl Silane Polymer 3]
90 g of ethyl acetate was introduced into a 200 ml capacity four-necked flask under a nitrogen atmosphere, mechanically stirred, and heated to 70° C. A preliminary mixture of 17.7 g of VPA, 4.4 g of the condensate 3 obtained at Synthesis Example 3, 17.7 g of acrylic acid, 0.36 g of azobisisobutyronitrile, and 30 g of ethyl acetate was added dropwise at 70° C. over 4 hours. After the end of the drop addition, the mixture was heated at 70° C. for at least 2 hours. As the reaction proceeds, the polymer precipitated. The reaction mixture was filtered and washed by ethyl acetate. After drying, a white polymer precipitate was obtained. The iodine value (g ($I_2$)/100 g (polymer)) was 3.2.

Synthesis Example 7

[Synthesis of Vinyl Silane Polymer 4]
90 g of ethyl acetate was introduced into a 200 ml capacity four-necked flask under a nitrogen atmosphere, mechanically stirred, and heated to 70° C. A preliminary mixture of 18.72 g of VPA, 1.1 g of the condensate 3 obtained at Synthesis Example 3, 18.2 g of acrylic acid, 0.36 g of azobisisobutyronitrile, and 30 g of ethyl acetate was added dropwise at 70° C. over 4 hours. After the end of the drop addition, the mixture was heated at 70° C. for at least 2 hours. As the reaction proceeds, the polymer precipitated. The reaction mixture was filtered and washed by ethyl acetate. After drying, a white polymer precipitate was obtained. The iodine value (g ($I_2$)/100 g (polymer)) was 0.9.

Synthesis Example 8

[Synthesis of Vinyl Silane Polymer 5]

90 g of ethyl acetate was introduced into a 200 ml capacity four-necked flask under a nitrogen atmosphere, mechanically stirred, and heated to 70° C. A preliminary mixture of 17.7 g of VPA, 4.4 g of the condensate 3 obtained at Synthesis Example 3, 17.7 g of acrylic acid, 0.36 g of azobisisobutyronitrile, and 30 g of ethyl acetate was added dropwise at 70° C. over 4 hours. After the end of the drop addition, the mixture was heated at 70° C. for at least 2 hours. As the reaction proceeds, the polymer precipitated. The reaction mixture was filtered and washed by ethyl acetate. After drying, a white polymer precipitate was obtained. The iodine value (g ($I_2$)/100 g (polymer)) was 3.2.

Comparative Synthesis Example 1

[Synthesis of Synthesis of Polymer 5]

90 g of ethyl acetate was introduced into a 200 ml capacity four-necked flask under a nitrogen atmosphere, mechanically stirred, and heated to 70° C. A preliminary mixture of 7.38 g of VPA, 29.5 g of methacrylic acid (hereinafter referred to as "MAA", made by Tokyo Chemical Industry), 1.3 g of azobisisobutyronitrile, and 30 g of ethyl acetate was added dropwise at 70° C. over 4 hours. After the end of the drop addition, the mixture was heated at 70° C. for at least 2 hours. As the reaction proceeds, the polymer precipitated. The reaction mixture was filtered and washed by ethyl acetate. After drying, a white polymer precipitate was obtained.

Comparative Synthesis Example 2

[Synthesis of Synthesis of Polymer 6]

90 g of ethyl acetate was introduced into a 200 ml capacity four-necked flask under a nitrogen atmosphere, mechanically stirred, and heated to 70° C. A preliminary mixture of 18.2 g of VPA, 18.2 g of methacrylic acid (hereinafter referred to as "AA", made by Tokyo Chemical Industry), 0.36 g of azobisisobutyronitrile, and 30 g of ethyl acetate was added dropwise at 70° C. over 4 hours. After the end of the drop addition, the mixture was heated at 70° C. for at least 2 hours. As the reaction proceeds, the polymer precipitated. The reaction mixture was filtered and washed by ethyl acetate. After drying, a white polymer precipitate was obtained.

Comparative Synthesis Example 3

[Synthesis of Synthesis of Polymer 7]

90 g of ethyl acetate was introduced into a 200 ml capacity four-necked flask under a nitrogen atmosphere, mechanically stirred, and heated to 70° C. A preliminary mixture of 33.3 g of VPA, 3 g of allyl methacrylate (hereinafter referred to as "AMA", made by Tokyo Chemical Industry), 0.36 g of azobisisobutyronitrile, and 25 g of ethyl acetate was added dropwise at 70° C. over 4 hours. After the end of the drop addition, the mixture was heated at 70° C. for at least 2 hours. As the reaction proceeds, the polymer precipitated. The reaction mixture was filtered and washed by ethyl acetate. After drying, a white polymer precipitate was obtained. The iodine value (g ($I_2$)/100 g (polymer)) was 11.7.

3. Examples

Example 1-4

An aluminum substrate brush roughened and anodized by sulfuric acid was treated in advance by a sodium silicate aqueous solution, then treated by an aqueous solution (2 g/l) of a vinyl silane polymer 1-4 heated to 60° C. Specifically, the above substrate was dipped in the above aqueous solution for 20 seconds, then the substrate was washed by deionized water, then dried at 100° C. for 90 seconds.

4. Comparative Examples

Comparative Example 1-3

A brush roughened and sulfuric acid anodized aluminum substrate was treated in advance by a sodium silicate aqueous solution, then was treated by the polymer 5-7 in an aqueous solution (2 g/l) heated to 60° C. Specifically, the above substrate was dipped in the above aqueous solution for 20 seconds, then the substrate was washed by deionized water, then dried at 100° C. for 90 seconds.

Comparative Example 4

A 2-liter capacity beaker was charged with 998 g of deionized water, then was charged with 1.8 g of the polymer 6 and 0.2 g of the condensate 3 of Synthesis Example 3. This solution was mechanically stirred until the polymer dissolved to obtain a mixed solution. The brush roughened and sulfuric acid anodized aluminum substrate was treated in advance by a sodium silicate aqueous solution, then was treated by the above mixed solution heated to 60° C. Specifically, the above substrate was dipped in the above mixed solution for 20 seconds, then the substrate was washed by deionized water, then dried at 100° C. for 90 seconds.

5. Production of Photosensitive Planographic Printing Plate - 1

The substrates of Example 1-4 and Comparative Example 1-4 and a substrate treated by just a sodium silicate aqueous solution were coated with the solutions shown in Table 1 to give dry weights of the coatings of 1.5 g/m². Specifically, the above solution was coated using a wire-wrapped #26 rod and dried in a conveyor oven set to 100° C. for about 90 seconds.

TABLE 1

| Ingredients | Mass % |
| --- | --- |
| Urethane acrylate 1[1] | 1.40 |
| Graft copolymer 1[2] | 2.88 |
| Urethane acrylate 2[3] | 0.70 |
| Irgacure 250[4] | 0.30 |
| Infrared absorbing dye[5] | 0.07 |
| Mercapto-3-triazole[6] | 0.14 |
| Byk 336[7] | 0.14 |
| Silica compound[8] (30% solid content) | 0.95 |
| n-propanol | 46.66 |
| Water | 23.38 |
| Methyl ethyl ketone | 23.38 |
| Total amount | 100.00 |

[1] 80 mass % solution in 2-butanone obtained by reacting DESMODUR N100 (aliphatic polyisocyanate resin based on hexamethylene diisocyanate, made by Bayer) with hydroxyethyl acrylate and pentaerythritol triacrylate.
[2] 21% dispersion of copolymer of acrylonitrile/polyethyleneglycol methyl ether methacrylate/styrene in 80/20 mixture of n-propanol/water
[3] 40 mass % solution in DMAC obtained by reacting DESMODUR N3200 (aliphatic polyisocyanate resin based on hexamethylene diisocyanate, made by Bayer) with 2-amino-4-hydroxy-6-methyl pyrimidine and polyethyleneglycol monoacrylate (Mn = 512, made by NOF Corporation AE-400).
[4] 75% solution of iodonium (4-methoxyphenyl[4-(2-methyl propyl)phenyl]hexafluorophosphoric acid) in propylene carbonate (made by Ciba Specialty Chemicals)
[5] Solution of cationic dye of the above-mentioned chemical formula (8) having absorption in near infrared region
[6] Mercapto-3-triazole-1H,2,4 available from PCAS (France)
[7] 25% solution of modified dimethyl polysiloxane copolymer in xylene/methoxypropyl acetic acid solution (made by Byk Chemie (France))
[8] Solution of surface modified colloidal silica particles (surface having unsaturated double bonds present)

6. Production of Photosensitive Planographic Printing Plate - 2

The substrates of Example 1-4 and Comparative Example 1-4 and a substrate treated by just a sodium silicate aqueous solution were coated with the solutions shown in Table 2 to give dry weights of the coatings of 1.5 g/m². Specifically, the above solution was coated using a wire-wrapped #26 rod and dried in a conveyor oven set to 100° C. for about 90 seconds.

TABLE 2

| Ingredients | Mass % |
| --- | --- |
| Binder 1[1] | 4.80 |
| Onium salt[2] | 0.90 |
| Dipentaerythritol hexacrylate[3] | 3.00 |
| Organic boron initiator[4] | 0.60 |
| Infrared absorbing dye[5] | 0.20 |
| DC-190[6] | 0.20 |
| Crystal Violet[7] | 0.30 |
| Methyl cellusolve | 70.00 |
| Methyl ethyl ketone | 20.00 |
| Total amount | 100.00 |

[1]Copolymer of allyl methacrylate and methacrylic acid (yellow-white powder)
[2]Diphenyl iodonium hexafluorophosphate (made by Tokyo Chemical Industry)
[3]Kayarad DPHA (made by Nippon Kayaku)
[4]Organic boron initiator of the following formula

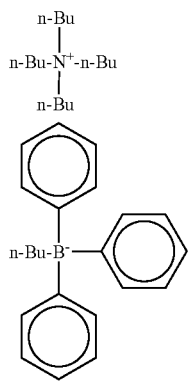

[5]Infrared absorbing dye of the following formula

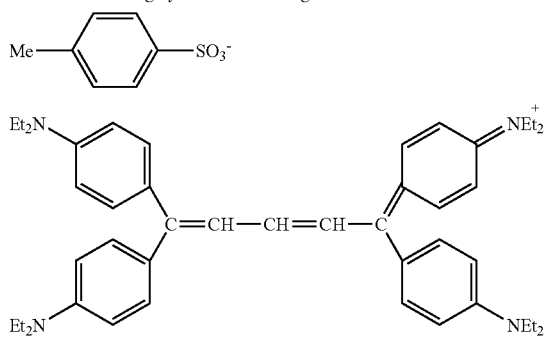

[6]10 mass % solution of surfactant in propylene glycol monomethylether (PGME) available from Dow Chemicals
[7]Visible pH indicator. Also known as Basic Violet 3 (made by Tokyo Chemical Industry)

7. Evaluation 1

Each photosensitive planographic printing plate produced in "Production 1 of Photosensitive Planographic Printing Plate" was evaluated for the bonding degree of the photosensitive layer to the substrate, the ink smut resistance characteristic at the time of printing, and the developability. The results are shown in Table 3. This was used to form an image using a Cleo Trendsetter 3244 at a drum speed of 90 rpm and a setting power of 10 W (225 mJ/cm²). The above characteristics were obtained by manually applying ink in a laboratory. That is, a planographic printing plate formed with an image was washed by 1% of IPA and 1% of NA-108W (wetting solution made by Dainippon Ink and Chemicals), then part was rubbed by a cloth impregnated with ink 1 time, 2 times, 3 times, 5 times, and 20 times. The developability was determined by the developed appearance of the rubbed planographic printing plate. Next, the wetted non-image regions were slowly rubbed by a cloth impregnated with ink. In several planographic printing plates, the ink did not move to the non-image regions. In these cases, these planographic printing plates were judged to have good ink smut resistance characteristics. The image regions were also rubbed for judging the above bonding degree. The bonding degree was judged from the damage of the image regions by this rubbing.

Further, the planographic printing plate obtained in each of Example 1-4 and Comparative Example 4 was used for a printing test. The printing test was conducted using as a printer a Komori S-26 (Komori S-26) or Roland R-200, as the ink, a DIC GEOS-G N grade, as the printing paper, Oji Paper Royal Coat 44.5 kg/A, as the wetting solution, DIC K-705 1%+IPA 10% aqueous solution and DIC NA-108W 1%+IPA 1%, and as the blanket a Kinyosha S-7400. If using the Komori S-26 to continue with an accelerated printing life test, along with time, the beta image region became damaged. When damage was observed in the paper, it could be judged that the printing life was over. This printing test was repeated for 6000 printings. In the printability test using the Roland R-200, the non-image regions of the plate should finish being developed after 10 turns of the wetting solution roll, while the image regions should accept sufficient ink after printing sheets 30 times. If these characteristics are not impaired by the printing test, printability is deemed good.

As clear from the results of Table 3, the results of evaluation of the bonding degree in the laboratory are correlated with the printing life in the printing test and similarly the results of evaluation of the ink smut resistance characteristic in the laboratory are correlated with the printability in the printing test.

TABLE 3

| | Photosensitive planographic printing plate | | Evaluation | | Printing test | |
|---|---|---|---|---|---|---|
| | Undercoat layer polymer | Treatment solution | Substrate bondability | Ink smut resistance characteristic | Printing life | Printability |
| Ex. 1 | HEMA + VTMS type | 2 g/l | A | B | 6000 | Good |
| Ex. 2 | PEGMA + VTMS type | 2 g/l | A | A | 6000 | Good |
| Ex. 3 | VTMS type (large amount of VTMS) | 2 g/l | A | A | 6000 | Good |
| Ex. 4 | VTMS type (small amount of VTMS) | 2 g/l | B | A | 2500 | Good |
| Comp. Ex. 1 | VPA/MAA polymer | 2 g/l | E | A | 100 or less | Good |
| Comp. Ex. 2 | VPA/AA polymer | 2 g/l | D | A | 200 | Good |
| Comp. Ex. 3 | VPA/AMA polymer | 2 g/l | A | E | 6000 | Poor |
| Comp. Ex. 4 | VPA/AA polymer | 2 g/l + VTMS oligomer 0.2 g/l | C | A | 500 | Good |

*For the characteristics in the columns, A (maximum) to E (minimum) were used.

From Example 1-3, it is clear that VPA copolymers containing a radical reactive silane oligomer are excellent in both printing life and printability. Comparing the examples and Comparative Example 3, it is learned that ethylenically unsaturated groups should be directly bonded to the silicon atoms.

8. Evaluation 2

Each photosensitive planographic printing plate produced in "Production 2 of Photosensitive Planographic Printing Plate" was used to form an image using a Cleo Trendsetter 3244, a drum speed of 150 rpm, and a setting power of 10 W (120 mJ/cm$^2$). Each planographic printing plate formed with an image was developed by a KPG Plate Processor PK-910 using a developer containing 14 parts of PD-1+140 parts of water+40 parts of NBL.

Further, the developed planographic printing plate was used for a printing test. The printing test was conducted using as a printer a Komori S-26 (Komori S-26) or Roland R-200, as the ink, a DIC GEOS-G N grade, as the printing paper, Oji Paper Royal Coat 44.5 kg/A, as the wetting solution, DIC K-705 1%+IPA 10% aqueous solution and DIC NA-108W 1%+IPA 1%, and as the blanket a Kinyosha S-7400. If using the Komori S-26 to continue with an accelerated printing life test, along with time, the beta image region became damaged. When damage was observed in the paper, it could be judged that the printing life was over. This printing test was repeated for 6000 printings. In the printability test using the Roland R-200, the non-image regions of the plate should finish being developed after 10 turns of the wetting solution roll, while the image regions should accept sufficient ink after printing sheets 30 times. If these characteristics are not impaired by the printing test, printability is deemed good.

As clear from the results of Table 4, the results of evaluation of the bonding degree in the laboratory are correlated with the printing life in the printing test and similarly the results of evaluation of the ink smut resistance characteristic in the laboratory are correlated with the printability in the printing test.

TABLE 4

| | Photosensitive planographic printing plate | | Printing test | |
|---|---|---|---|---|
| | Undercoat layer polymer | Treatment solution | Printing life | Printability |
| Ex. 1 | HEMA+VTMS type | 2 g/l | 10000 | Good |
| Ex. 2 | PEGMA+VTMS type | 2 g/l | 10000 | Good |
| Ex. 3 | VTMS type (large amount of VTMS) | 2 g/l | 10000 | Good |
| Ex. 4 | VTMS type (small amount of VTMS) | 2 g/l | 3000 | Good |
| Comp. Ex. 1 | VPA/MAA polymer | 2 g/l | 300 | Good |
| Comp. Ex. 2 | VPA/AA polymer | 2 g/l | 500 | Good |
| Comp. Ex. 3 | VPA/AMA polymer | 2 g/l | 10000 | No good |
| Comp. Ex. 4 | VPA/AA polymer | 2 g/l + VTMS oligomer 0.2 g/l | 1000 | Good |

*For the characteristics in the columns, A (maximum) to E (minimum) were used.

From Example 1-3, it is clear that VPA copolymers containing a radical reactive silane oligomer are excellent in both printing life and printability. Comparing the examples and Comparative Example 3, it is learned that ethylenically unsaturated groups should be directly bonded to the silicon atoms.

INDUSTRIAL APPLICABILITY

The photosensitive planographic printing plate of the present invention is superior in printing resistance and can improve the printing life of the planographic printing plate since the bondability of the photosensitive layer and substrate is excellent. Further, the photosensitive planographic printing plate of the present invention is also provided with an excellent ink smut resistance characteristic.

The invention claimed is:

1. A photosensitive planographic printing plate comprising a substrate and a photosensitive layer including a photopolymerizable compound, wherein
said photosensitive layer and said substrate are provided between them with
an undercoat layer including a (co)polymer having structural units in the main chain, which (co)polymer is derived from a monomer that has a pendant ethylenically unsaturated group bonded with a silicon atom and a monomer having a phosphonic acid group.

2. The photosensitive planographic printing plate as set forth in claim 1, wherein the structural units having ethylenically unsaturated groups bonded with the silicon atoms are expressed by:

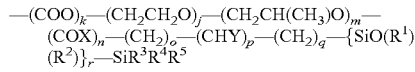

where, $R^1$ and $R^2$ respectively independently indicate groups selected from the group comprised of a hydroxy group, $C_1$ to $C_6$ alkoxy group, $-CH=CH_2$, and $-OSiR^3R^4R^5$, $R^3$, $R^4$, and $R^5$ respectively independently indicate groups selected from the group comprised of a hydroxy group, $C_1$ to $C_6$ alkoxy group, and $-CH=CH_2$, however, at least one of $R^3$, $R^4$, and $R^5$ is $-CH=CH_2$, and X is a bivalent organic group selected from $-CH_2-$, $-O-$, $-S-$, and $-NZ-$ wherein Z indicates H or a $C_1$ to $C_6$ alkyl group, Y indicate a $C_1$ to $C_6$ alkyl group or a halogen atom, k and n respectively independently indicate 0 or 1, j and m respectively independently indicate integers of 0 to 500, and o, p, q, and r respectively independently indicate integers of 0 to 5.

3. The photosensitive planographic printing plate as set forth in claim 1, wherein said phosphonic acid group is expressed by $-P(=O)(OR^6)(OR^7)$ where, $R^6$ and $R^7$ respectively independently indicate H or a $C_1$ to $C_6$ alkyl group.

4. The photosensitive planographic printing plate as set forth in claim 1, wherein said (co)polymer further has a carboxylic acid group, carboxylic acid ester group, or amide group expressed by $-COR^8$ where, $R^8$ indicates a hydroxy group or $C_1$ to $C_6$ alkoxy group or $-NH_2$.

5. The printing plate of claim 1 wherein the structural units from said monomer having ethylenically unsaturated groups bonded with a silicon atom are present in said (co)polymer in an amount of from about 0.05 to 50 mol% of the total structural units.

6. The printing plate of claim 1 wherein said (co)polymer is present in said undercoat layer in an amount of from 80 to 100 weight %.

7. The printing plate of claim 1 wherein said undercoat layer is present at a coverage of from 1 to 100 mg/m².

8. The printing plate of claim 1 wherein said photosensitive layer comprises one or more of an infrared absorbent, a photopolymerization initiator, and a binder resin.

9. The printing plate of claim 8 wherein said photosensitive layer comprises an infrared absorbent in an amount of from 0.5 to 15 weight %, and that is represented by the following formula:

$$D^+A^-$$

10. The printing plate of claim 9 wherein $D^+$ comprises a methine chain having 5 or 7 carbon atoms, which chain is terminated with one or more N-containing heterocyclic or aryl groups, and $A^-$ represents one or more, halo, $ClO_4^-$, $PF_6^-$, $BF_4^-$, $SbF_6^-$, $CH_3SO_3^-$, $CF_3SO_3^-$, $C_6H_5SO_3^-$, $CH_3C_6H_4SO_3^-$, $HOC_6H_4SO_3^-$, $ClC_6H_4SO_3^-$, and tetraorganic boron anions.

11. The printing plate of claim 8 wherein said photopolymerization initiator includes one or more of an organic boron compound, an onium salt, and a triazine-based compound.

12. The printing plate of claim 11 wherein said photopolymerization initiator comprises an ammonium salt of a boron anion.

13. The printing plate of claim 1 wherein said substrate is a hydrophilic aluminum-containing substrate.

14. The printing plate of claim 1 that is on-press developable.

15. A method of preparing a planographic printing plate comprising:
A) exposing the photosensitive planographic printing plate of claim 1 to imaging radiation to provide exposed and non-exposed regions, and
B) with or without a heating process, removing the non-exposed regions.

16. The method of claim 14 wherein said imaging radiation is infrared radiation.

17. The method of claim 15 wherein said non-exposed regions are removed by development on-press.

18. The method of claim 15 wherein said non-exposed regions are removed by development off-press using an alkaline developer.

19. A method of preparing the photosensitive planographic printing plate of claim 1 comprising
A) forming an undercoat layer on a substrate either: (1) by dipping said substrate into a solution of a (co)polymer having structural units in the main chain, which (co) polymer is derived from a monomer that has a pendant ethylenically unsaturated group bonded with a silicon atom and a monomer having a phosphonic acid group, and rinsing the substrate with water to remove unreacted (co)polymer, or (2) by coating said substrate with said (co)polymer solution, and
B) applying a photosensitive layer comprising a photosensitive compound to said undercoat layer.

* * * * *

UNITED STATES PATENT AND TRADEMARK OFFICE
CERTIFICATE OF CORRECTION

| | |
|---|---|
| PATENT NO. | : 7,883,830 B2 |
| APPLICATION NO. | : 11/817876 |
| DATED | : February 8, 2011 |
| INVENTOR(S) | : Koji Hayashi et al. |

It is certified that error appears in the above-identified patent and that said Letters Patent is hereby corrected as shown below:

Issued Patent

| Column | Line | Description of Error |
|---|---|---|
| 34 | 9 | In Claim 9, delete "$D^+ A^-$" insert -- $D^+ A^-$ wherein $D^+$ is a cationic dye and $A^-$ is an anion. --, therefor. |

Signed and Sealed this
Nineteenth Day of July, 2011

David J. Kappos
*Director of the United States Patent and Trademark Office*